(12) United States Patent
Chen et al.

(10) Patent No.: US 10,197,648 B2
(45) Date of Patent: Feb. 5, 2019

(54) GRADIENT COIL CHECKING DEVICE AND MAGNETIC RESONANCE IMAGING SYSTEM

(71) Applicant: Siemens Healthcare GmbH, Erlangen (DE)

(72) Inventors: Qi Xing Chen, Shenzhen (CN); Xiao Guang Liu, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 350 days.

(21) Appl. No.: 14/989,125

(22) Filed: Jan. 6, 2016

(65) Prior Publication Data

US 2016/0195596 A1 Jul. 7, 2016

(30) Foreign Application Priority Data

Jan. 6, 2015 (CN) .................. 2015 2 0007845 U

(51) Int. Cl.
*G01V 3/00* (2006.01)
*G01R 33/385* (2006.01)
*G01R 33/28* (2006.01)

(52) U.S. Cl.
CPC ....... *G01R 33/3852* (2013.01); *G01R 33/288* (2013.01)

(58) Field of Classification Search
CPC .. A61B 5/055; G01R 33/5608; G01R 33/543; G01R 33/385; G01R 33/5659

(Continued)

(56) References Cited

U.S. PATENT DOCUMENTS

| 4,585,995 A * | 4/1986 | Flugan ................. G01R 33/421 324/318 |
| 2011/0298603 A1* | 12/2011 | King ..................... G08G 1/042 340/436 |

(Continued)

OTHER PUBLICATIONS

Translation of Hida (JP 11205136 A) listed in the IDS, publication date: Jul. 30, 1999. (Year: 1999).*

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

The present utility model provides a gradient coil detection device and an MRI system. The gradient coil checking device for an MRI system comprises: a voltage sampling circuit, comprising: a sample voltage input end, connected between a gradient power amplifier of the MRI system and the gradient coil and obtaining a gradient coil sample voltage, and a sample voltage output end; a current sampling circuit, a sample current input end, connected to the gradient power amplifier of the MRI system and obtaining a gradient coil sample current, and a sample current output end; a calculation unit, connected to the sample voltage output end and the sample current output end, and used for calculating a gradient coil calculated resistance according to the gradient coil sample voltage and the gradient coil sample current; a comparison unit, connected to the calculation unit, and used for comparing the gradient coil calculated resistance with a reference value to obtain a result signal. The gradient coil checking device for an MRI system according to a particular embodiment of the present utility model can check the operating state of the gradient coil in real time while the MRI system is scanning.

11 Claims, 1 Drawing Sheet

(58) Field of Classification Search
USPC .......................................................... 324/399
See application file for complete search history.

(56) References Cited

U.S. PATENT DOCUMENTS

| | | | | |
|---|---|---|---|---|
| 2014/0169571 A1* | 6/2014 | Polleros | ................ | H04R 3/007 |
| | | | | 381/55 |
| 2014/0347049 A1* | 11/2014 | Tsai | .................... | G01R 35/005 |
| | | | | 324/307 |

* cited by examiner

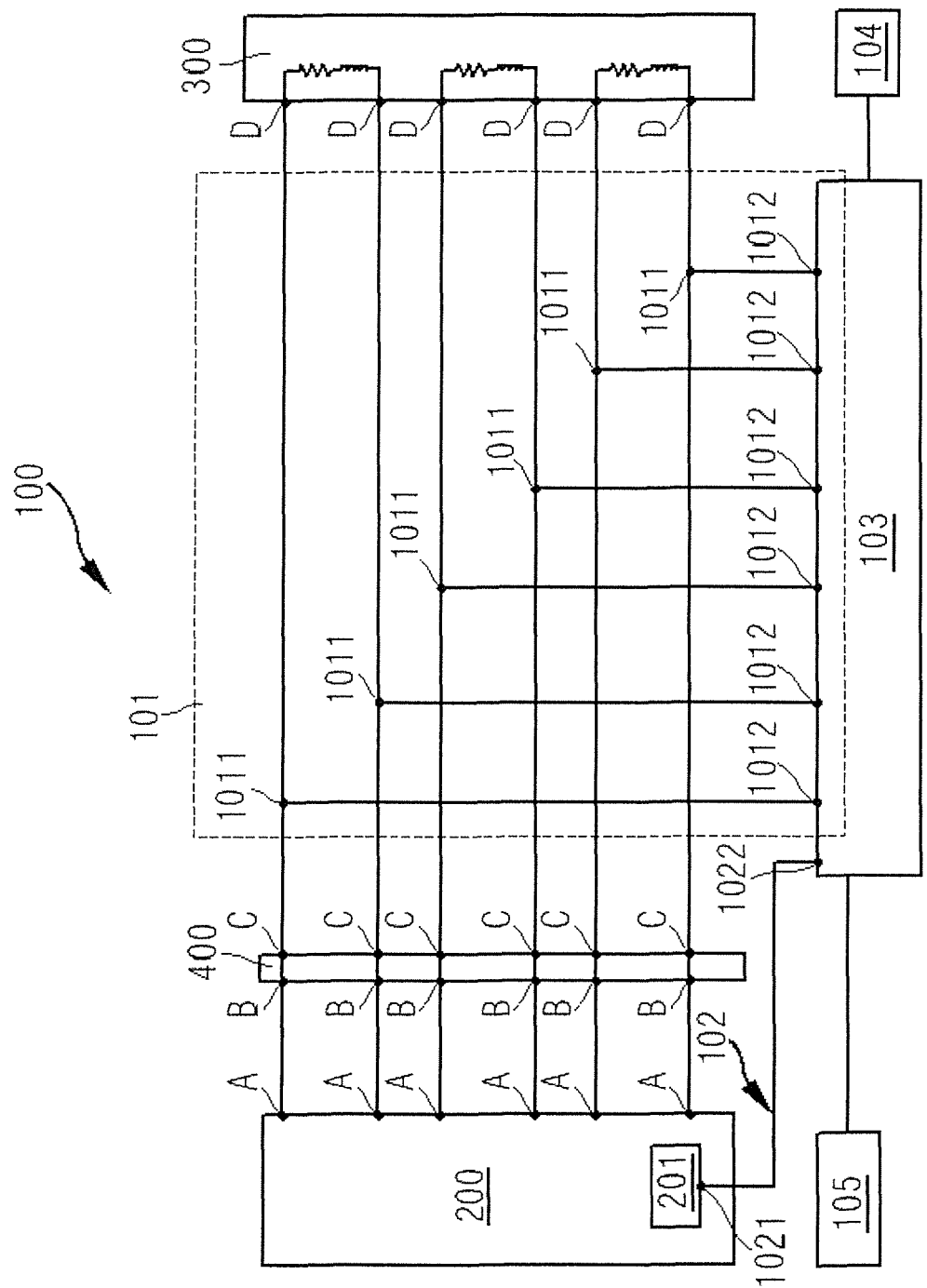

GRADIENT COIL CHECKING DEVICE AND MAGNETIC RESONANCE IMAGING SYSTEM

BACKGROUND OF THE INVENTION

Field of the Invention

The present utility model relates to the field of magnetic resonance imaging, in particular to a gradient coil checking device.

Description of the Prior Art

Magnetic resonance imaging (MRI) is a technology in which the phenomenon of magnetic resonance is utilized for the purpose of imaging. The principles of magnetic resonance are as follows. When an atomic nucleus contains a single proton, as is the case for the nuclei of the hydrogen atoms that are present throughout the human body, this proton exhibits spin motion and resembles a small magnet. The spin axes of these small magnets normally lack a definite pattern, but when an external magnetic field is applied, the small magnets will be rearranged according to the magnetic force lines of the external magnetic field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis, the atomic nuclei have a transverse magnetization component.

When emission of the RF pulse has ended, the excited atomic nuclei emit an echo signal, gradually releasing the absorbed energy in the form of electromagnetic waves, such that their phase and energy both return to the pre-excitation state. An image can be reconstructed by subjecting the echo signal emitted by atomic nuclei to further processing. The echo signals are spatially encoded by gradient magnetic fields produced by gradient coils, so that the location from which the echo signals originate can be determined by further processing of the detected (received) echo signals, so that an image can be generated.

At present, MRI systems require stronger gradient magnetic fields during application than in the past, therefore ever greater currents must be applied to the MRI system gradient coils.

Under the action of such powerful currents (hundreds of amperes), damage to gradient coils may result if there are any connection defects during manufacture or integration of the gradient coils. An example of the most direct damage is destruction by burning.

SUMMARY OF THE INVENTION

In view of the above, an object of the invention is to provide a gradient coil checking device for an MRI system that is able to identify when a gradient coil is at risk of such damage, so as to allow a remedial action to be taken.

This object is achieved by a gradient coil checking device in accordance with the invention that has a voltage sampling circuit having a sample voltage input connected between a gradient power amplifier of the MRI system and the gradient coil so as to obtain a gradient coil sample voltage, and a sample voltage output. The gradient coil checking device also has a current sampling circuit, a sample current input connected to the gradient power amplifier of the MRI system so as to obtain a gradient coil sample current, and a sample current output. The gradient coil checking device also has a calculation processor connected to the sample voltage output and the sample current output, that is configured to calculate a gradient coil calculated resistance according to the gradient coil sample voltage and the gradient coil sample current. The gradient coil checking device also has a comparator connected to the calculation processor that compares the gradient coil calculated resistance with a reference value to obtain a result signal.

Preferably, the gradient coil checking device also has a switch-on circuit that switches on the voltage sampling circuit and the current sampling circuit according to a synchronous clock of the MRI system.

Preferably, if the gradient coil calculated resistance is greater than or equal to the reference value, the result signal is emitted in the form of a switch-off signal or an alert signal.

Preferably, the gradient coil checking device also has a switch-off circuit, connected to the comparator, that switches off the gradient power amplifier according to the switch-off signal.

Preferably, the gradient coil checking device also has an alert circuit, connected to the comparator, that issues a humanly perceptible alert according to the alert signal.

Preferably, the MRI system has a filter circuit, the filter circuit having a filter input and a filter output, the filter input being connected to the gradient power amplifier of the MRI system via a first conducting wire, and the filter output being connected to the gradient coil via a second conducting wire, with the sample voltage input being connected to any point on the first conducting wire, or the sample voltage input being connected to any point on the second conducting wire.

Preferably, the sample voltage input is connected to an output of the gradient power amplifier; or the sample voltage input end is connected to an input of the gradient coil.

Preferably, the calculation processor is also configured to calibrate the gradient coil calculated resistance.

Preferably, the calculation processor includes an adder or a multiplier, that calibrates the gradient coil calculated resistance by adding thereto, or multiplying by, a calibration value. The longer the service life of the MRI system, the greater the calibration value.

The present invention also encompasses a magnetic resonance imaging (MRI) system that embodies a checking device designed according to one or more of the embodiments described above.

The gradient coil checking device for an MRI system according to the present invention can check the operating state of the gradient coil in real time while the MRI system is scanning, and furthermore, if the operating state of the gradient coil does not conform to a standard, then the gradient coil checking device according to the present invention can stop operation of the gradient coil and other adjacent components so as to avoid greater loss.

BRIEF DESCRIPTION OF THE DRAWINGS

The single FIGURE is a modular diagram of a gradient coil checking device for an MRI system according to an embodiment of the invention.

DESCRIPTION OF THE PREFERRED EMBODIMENTS

In an MRI system, there are various ways to prevent damage to gradient coils, for example: a temperature sensor can be disposed in the gradient coil, so as to detect the state of the gradient coil by the temperature of the gradient coil, but this method is dependent on the position of the temperature sensor, so there is a possibility that the gradient coil will suffer damage in certain positions that are not covered by any temperature sensor. A smoke detector may be disposed in the gradient coil, so as to detect the state of the gradient coil by smoke caused by high temperature in the gradient coil, but this method is dependent on air circulation, and it is generally the case that when the smoke detector detects smoke, the gradient coil is already damaged.

The FIGURE shows a modular diagram of a gradient coil checking device for an MRI system according to an embodiment of the invention. As the diagram shows, a gradient coil checking device 100 for an MRI system according to an embodiment of the invention has a voltage sampling circuit 101, having a sample voltage input 1011, connected between a gradient power amplifier 200 of the MRI system and the gradient coil 300 so as to obtain a gradient coil sample voltage, and a sample voltage output 1012. Multiple voltage sampling circuits are provided to correspond to multiple gradient coils. The device 100 also has current sampling circuit 102, a sample current input 1021, connected to the gradient power amplifier 200 of the MRI system so as to obtain a gradient coil sample current, and a sample current output 1022. The sample current input 1021 may obtain a gradient coil sample current directly from a control processor 201 of the gradient power amplifier 200, or can obtain a gradient coil sample current from the connection between the gradient power amplifier 200 and the gradient coil 300. The device 100 also has a calculation processor 103, connected to the sample voltage output 1012 and the sample current output 1022, configured to calculate a gradient coil calculated resistance according to the gradient coil sample voltage and the gradient coil sample current. The device 100 also has a comparator 104, connected to the calculation processor 103, that compares the gradient coil calculated resistance with a reference value (which may be set by a user or by a system) to obtain a result signal.

If the gradient coil calculated resistance is greater than or equal to the reference value, the result signal is a switch-off signal or an alert signal. If the gradient coil calculated resistance is less than the reference value, the result signal is a maintain signal or a safe signal.

The gradient coil checking device 100 also has a switch-off circuit, connected to the comparison unit 104, that switches off the gradient coil 300 according to the switch-off signal. The switch-off circuit may be connected to the gradient power amplifier 200 or connected to the gradient coil 300, so the way in which the gradient coil 300 is switched off will be either by switching off an output of the gradient power amplifier 200 or by disconnecting the gradient coil 300.

The gradient coil checking device 100 also has an alert circuit, connected to the comparator 104 that issues an alert, in a humanly perceptible form, according to the alert signal.

The gradient coil checking device 100 also has a switch-on circuit 105, that switches on the checking device 100 according to a synchronous clock of the MRI system (the switch-on circuit 105 may obtain a synchronous clock directly from the gradient power amplifier 200, or may obtain a synchronous clock from a synchronous clock source of the MRI system), specifically switching on the voltage sampling circuit 101 and the current sampling circuit 102.

The MRI system has a filter circuit 400, that has a filter input B and a filter output C. The filter input B is connected to an output A of the gradient power amplifier of the MRI system via a first conducting wire, and the filter output C is connected to an input D of the gradient coil via a second conducting wire. The sample voltage input 1011 is connected to any point on the first conducting wire, or the sample voltage input 1011 is connected to any point on the second conducting wire. By connecting the sample voltage input 1011 at different points, checking results for different ranges can be obtained, including the gradient coil itself and/or the first conducting wire and/or the second conducting wire and/or the filter circuit 400.

Regardless of whether the filter circuit 400 is present, the sample voltage input 1011 can be connected to the output A of the gradient power amplifier, thereby enabling the gradient coil and the conducting wire between the gradient power amplifier and the gradient coil to be checked, or the sample voltage input end can be connected to the input D of the gradient coil, thereby enabling only the gradient coil to be checked.

The calculation processor 103 is also configured to calibrate the gradient coil calculated resistance. Calibration can be performed in various ways, for example by checking a table, or the calculation processor 103 can have an adder or a multiplier, for calibrating the gradient coil calculated resistance by adding thereto or multiplying by, a calibration value. The longer the service life of the MRI system, the greater the calibration value.

In summary, the gradient coil checking device 100 can check the operating state of the gradient coil in real time while the MRI system is scanning. Furthermore, if the operating state of the gradient coil does not conform to a standard, then the gradient coil checking device 100 can stop operation of the gradient coil and other adjacent components so as to avoid greater loss.

Although modifications and changes may be suggested by those skilled in the art, it is the intention of the inventor to embody within the patent warranted hereon all changes and modifications as reasonably and properly come within the scope of his contribution to the art.

We claim as our invention:

1. A gradient coil checking device for a magnetic resonance imaging (MRI) system, comprising:
    a voltage sampling circuit, comprising:
        a sample voltage input, connected between a gradient power amplifier of the MRI system and the gradient coil so as to obtain a gradient coil sample voltage, and
        a sample voltage output;
    a current sampling circuit, comprising:
        a sample current input, connected to the gradient power amplifier of the MRI system so as to obtain a gradient coil sample current, and
        a sample current output;
    a switch-on circuit that switches on the voltage sampling circuit and the current sampling circuit according to a synchronous clock of the MRI system;

a calculation processor, connected to the sample voltage output and the sample current output, configured to calculate a gradient coil calculated resistance according to the gradient coil sample voltage and the gradient coil sample current; and a comparator connected to the calculation processor, that compares the gradient coil calculated resistance with a reference value to obtain a comparison result and to emit an electrical result signal that represents said comparison result.

2. A magnetic resonance imaging (MRI) system comprising:
- a magnetic resonance scanner comprising a gradient power amplifier and a gradient coil operated by said gradient power amplifier;
- a voltage sampling circuit, comprising:
  - a sample voltage input, connected between said gradient power amplifier and said gradient coil so as to obtain a gradient coil sample voltage, and
  - a sample voltage output;
- a current sampling circuit, comprising:
  - a sample current input, connected to the gradient power amplifier of the MRI system so as to obtain a gradient coil sample current, and
  - a sample current output;
- a switch-on circuit that switches on the voltage sampling circuit and the current sampling circuit according to a synchronous clock of the MRI system;
- a calculation processor, connected to the sample voltage output and the sample current output, configured to calculate a gradient coil calculated resistance according to the gradient coil sample voltage and the gradient coil sample current; and
- a comparator connected to the calculation processor, that compares the gradient coil calculated resistance with a reference value to obtain a comparison result and to emit an electrical result signal that represents said comparison result.

3. The checking device as claimed in claim 1 comprising a switch-off circuit connected to the comparator and adapted for connection to the gradient power amplifier, said switch-off circuit switching-off the gradient power amplifier upon emission of said result signal by said comparator.

4. The checking device as claimed in claim 1 comprising an alert circuit connected to said comparator, that issues a humanly perceptible alert when said result signal represents that said gradient coil calculated resistance exceeds said reference value.

5. The checking device as claimed in claim 1, wherein the MRI system comprises a filter circuit, the filter circuit comprising a filter input and a filter output, the filter input being connected to the gradient power amplifier of the MRI system via a first conducting wire, and the filter output being connected to the gradient coil via a second conducting wire, and wherein
- the sample voltage input is connected to any point on the first conducting wire; or
- the sample voltage input is connected to any point on the second conducting wire.

6. The checking device as claimed in claim 1, wherein the sample voltage input is connected to an output of the gradient power amplifier, or the sample voltage input is connected to an input of the gradient coil.

7. The checking device as claimed in claim 1, wherein the calculation processor is also configured to calibrate the gradient coil calculated resistance.

8. The checking device as claimed in claim 7 wherein said calculation processor comprises an adder, and wherein said calculation processor is configured to calibrate the gradient coil calculated resistance by adding a calibration value, with said adder, to said gradient coil calculated resistance, said calibration value increasing with increasing service life of said MRI system.

9. The checking device as claimed in claim 7 wherein said calculation processor comprises a multiplier, and wherein said calculation processor is configured to calibrate the gradient coil calculated resistance by multiplying, with said multiplier, the gradient coil calculated resistance by a calibration value, with the calibration value increasing with increasing service life of the MRI system.

10. The MRI system as claimed in claim 2 comprising an alert circuit connected to said comparator, that issues a humanly perceptible alert when said result signal by said comparator represents that said gradient coil calculated resistance exceeds said reference value.

11. The MRI system as claimed in claim 2 comprising:
- a filter circuit, the filter circuit comprising a filter input and a filter output, the filter input being connected to the gradient power amplifier of the MRI system via a first conducting wire, and the filter output being connected to the gradient coil via a second conducting wire;
- the sample voltage input being connected to any point on the first conducting wire; or
- the sample voltage input being connected to any point on the second conducting wire.

* * * * *